(12) United States Patent
Shim

(10) Patent No.: US 11,792,549 B2
(45) Date of Patent: Oct. 17, 2023

(54) IMAGE SENSOR WITH A ROW DRIVER INCLUDING A TRANSMISSION CONTROL SIGNAL GENERATOR

(71) Applicant: SAMSUNG ELECTRONICS CO., LTD., Suwon-si (KR)

(72) Inventor: Eunsub Shim, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 36 days.

(21) Appl. No.: 17/522,021

(22) Filed: Nov. 9, 2021

(65) Prior Publication Data

US 2022/0311965 A1 Sep. 29, 2022

(30) Foreign Application Priority Data

Mar. 26, 2021 (KR) .................. 10-2021-0039839

(51) Int. Cl.
*H04N 25/766* (2023.01)
*H01L 27/146* (2006.01)
*H04N 25/778* (2023.01)
*H04N 25/779* (2023.01)
*G06T 3/00* (2006.01)
(Continued)

(52) U.S. Cl.
CPC ......... *H04N 25/766* (2023.01); *G06T 3/0018* (2013.01); *G06T 3/4046* (2013.01); *G06T 7/80* (2017.01); *H01L 27/14616* (2013.01); *H04N 25/778* (2023.01); *H04N 25/779* (2023.01)

(58) Field of Classification Search
CPC .. H04N 25/766; H04N 25/778; H04N 25/779; H04N 23/57; H04N 23/69; H04N 25/76; H04N 25/59; H04N 25/60; H04N 25/7795; H04N 5/376; H04N 5/3765;
(Continued)

(56) References Cited

U.S. PATENT DOCUMENTS 8,673,426 B2 3/2014 Yamazaki et al.
10,701,294 B1 * 6/2020 Cremers ............. H04N 25/621
(Continued)

FOREIGN PATENT DOCUMENTS

JP 2001-186416 7/2001
KR 10-0731125 6/2007
KR 10-2020-0091842 7/2020

*Primary Examiner* — Albert H Cutler
(74) *Attorney, Agent, or Firm* — F. Chau & Associates, LLC

(57) ABSTRACT

An image sensor including: a pixel array including pixels each pixel including a photoelectric conversion element, a transmission transistor to transmit photocharges generated by the photoelectric conversion element to a floating diffusion node, and a reset transistor to reset the floating diffusion node based on a pixel power voltage; and a row driver to control the pixels, wherein the row driver includes a transmission control signal generator to provide a transmission control signal to the transmission transistor, wherein the transmission control signal generator includes: a first transistor to which a first voltage is applied; a second transistor connected to the first transistor; a third transistor to which a second voltage is applied, the second voltage being higher than the first voltage; and a fourth transistor connected to the third transistor, wherein an ON resistance of the second transistor is different from an ON resistance of the first transistor.

19 Claims, 9 Drawing Sheets

(51) Int. Cl.
*G06T 3/40* (2006.01)
*G06T 7/80* (2017.01)

(58) Field of Classification Search
CPC ......... H01L 27/14616; H01L 27/14612; H01L 27/14643
See application file for complete search history.

(56) References Cited

U.S. PATENT DOCUMENTS

| | | |
|---|---|---|
| 10,798,324 B2 | 10/2020 | Kumagai |
| 2007/0013799 A1* | 1/2007 | Hirota ................... H04N 23/81 348/311 |
| 2010/0309357 A1* | 12/2010 | Oike ................... H04N 25/766 348/E5.091 |
| 2013/0235242 A1* | 9/2013 | Watanabe .............. H04N 25/76 348/308 |
| 2020/0053266 A1 | 2/2020 | Ogushi |
| 2020/0145571 A1* | 5/2020 | Xu ......................... H04N 25/74 |
| 2020/0145597 A1* | 5/2020 | Prathipati .............. H04N 25/74 |
| 2020/0228740 A1 | 7/2020 | Otaka |

* cited by examiner

IMAGE SENSOR WITH A ROW DRIVER INCLUDING A TRANSMISSION CONTROL SIGNAL GENERATOR

CROSS-REFERENCE TO RELATED APPLICATION

This application claims priority under 35 U.S.C. § 119 to Korean Patent Application No. 10-2021-0039839, filed on Mar. 26, 2021 in the Korean Intellectual Property Office, the disclosure of which is incorporated by reference herein in its entirety.

TECHNICAL FIELD

The inventive concept relates to an image sensor.

DISCUSSION OF RELATED ART

Image sensors are devices that detect and convey information used to make an image. For example, image sensors capture two-dimensional or three-dimensional images of an object. The image sensors generate an image of the object by using a photo-sensing element, such as a photodiode, that reacts according to the intensity of light reflected from the object. Complementary metal-oxide semiconductor (CMOS) image sensors capable of implementing high resolution images are widely used in today's digital cameras and mobile phones.

SUMMARY

The inventive concept provides an image sensor with increased reliability.

According to an example embodiment of the inventive concept, there is provided an image sensor including: a pixel array including a plurality of pixels arranged in a matrix, wherein each of the pixels includes a photoelectric conversion element configured to generate and accumulate photocharges based on an amount of external incident light, a transmission transistor configured to transmit the photocharges generated by the photoelectric conversion element to a floating diffusion node, and a reset transistor configured to reset the floating diffusion node based on a pixel power voltage, wherein the photoelectric conversion element includes a terminal to which a pixel reference voltage is applied; and a row driver configured to control the pixels, wherein the row driver includes a transmission control signal generator configured to provide a transmission control signal to a gate electrode of the transmission transistor, wherein the transmission control signal generator includes: a first transistor of a first conductivity type and including a source electrode to which a first voltage is applied; a second transistor of the first conductivity type and including a source electrode connected to a drain electrode of the first transistor; a third transistor of a second conductivity type and including a source electrode to which a second voltage is applied, the second voltage being higher than the first voltage; and a fourth transistor of the second conductivity type and including a source electrode connected to a drain electrode of the third transistor, wherein an ON resistance of the second transistor is different from an ON resistance of the first transistor.

According to an example embodiment of the inventive concept, there is provided an image sensor including: a pixel array including a plurality of pixels, wherein each of the pixels includes a photoelectric conversion element configured to generate and accumulate photocharges and a transmission transistor configured to transmit the photocharges generated by the photoelectric conversion element, to a floating diffusion node; and a row driver configured to control the pixels, wherein the row driver includes: a transmission control signal generator configured to provide a transmission control signal to a gate electrode of the transmission transistor; and a plurality of transmission signal lines connecting the transmission transistor to the transmission control signal generator, wherein the transmission control signal generator further includes: a first transistor in which a first voltage is applied to a source electrode thereof; a second transistor including a source electrode connected to a drain electrode of the first transistor; a third transistor in which a second voltage higher than the first voltage is applied to a source electrode thereof; a fourth transistor including a source electrode connected to a drain electrode of the third transistor; and a delay circuit connected between a drain electrode of each of the second and fourth transistors and the transmission signal lines, wherein the delay circuit is configured to delay a transmission control signal output by the drain electrode of each of the second and fourth transistors.

According to an example embodiment of the inventive concept, there is provided an image sensor including: a pixel array including a plurality of pixels, wherein each of the pixels includes a photoelectric conversion element in which a pixel reference voltage is applied to an electrode thereof, a transmission transistor configured to transmit photocharges generated by the photoelectric conversion element to a floating diffusion node, and a reset transistor configured to reset the floating diffusion node based on a pixel power voltage; and a row driver configured to control the pixels, wherein the row driver includes a transmission control signal generator configured to provide a transmission control signal, which is a pulse signal changing between a first voltage and a second voltage higher than the first voltage, to a gate electrode of the transmission transistor, wherein the transmission control signal generator includes: a first transistor of a first conductivity type in which the first voltage is applied to a source electrode thereof; a second transistor of a second conductivity type in which the second voltage is applied to a source electrode thereof; and a current limiter arranged between the first and second transistors.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept are described in detail with reference to the accompanying drawings.

Figure 1:
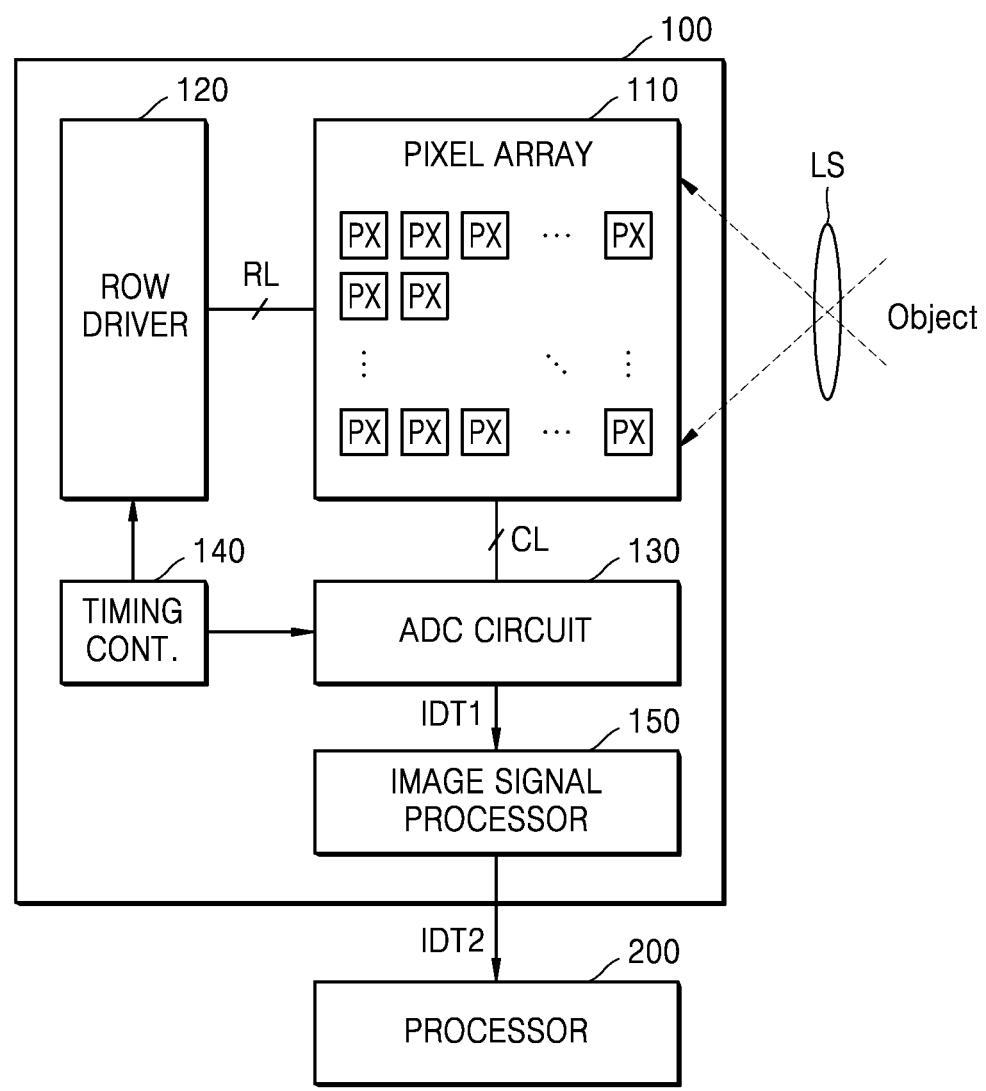
FIG. 1 is a schematic block diagram of an image sensor according to an example embodiment of the inventive concept.

FIG. 1 is a schematic block diagram of an image sensor 100 according to an example embodiment of the inventive concept.

The image sensor 100 may be mounted on an electronic device having an image or optical sensing function, and may be mounted on an electronic device having an auto-focusing function. For example, the image sensor 100 may be mounted on an electronic device such as a camera, a smartphone, a wearable device, Internet of Things (IoT), a personal computer (PC), a personal digital assistant (PDA), a portable multimedia player (PMP), and a navigation device. In addition, the image sensor 100 may be mounted on an electronic device provided as a component of vehicles, furniture, manufacturing equipment, doors, various measuring devices, etc.

The image sensor 100 may include a pixel array 110, a row driver 120, an analog-digital converting circuit (hereinafter, ADC circuit) 130, a timing controller 140, and an image signal processor 150.

The pixel array 110 may receive an optical signal of light that is incident via a lens LS and reflected by an object, and may convert the optical signal to an electrical signal. In an embodiment of the inventive concept, the pixel array 110 may be implemented by a complementary metal-oxide semiconductor (CMOS).

The pixel array 110 may be connected to a plurality of row lines RL and a plurality of column lines CL (or to be referred to as an output line). The pixel array 110 may include a plurality of pixels PX arranged in a matrix and connected to the plurality of row lines RL and the plurality of column lines CL.

Each of the plurality of pixels PX may sense a received optical signal by using a photoelectric conversion element. In this case, the photoelectric conversion element may include a photo-sensing element including an organic material or an inorganic material, such as an inorganic photodiode, an organic photodiode, a perovskite photodiode, a phototransistor, a photogate, and a pinned photodiode. However, the inventive concept is not limited thereto, and the photoelectric conversion element may include a material such as an organic optical conductive layer.

The plurality of pixels PX may detect an amount of light of an optical signal, and output a sensing signal, which is an electrical signal representing the detected amount of light. The plurality of pixels PX may include a red pixel PX, a green pixel PX, and a blue pixel PX. The red pixel PX may generate the sensing signal corresponding to a red color optical signal, in response to wavelengths in a red range of a visible light range. The green pixel PX may generate a sensing signal corresponding to a green color optical signal, in response to wavelengths in a green range of the visible light range. The blue pixel PX may generate a sensing signal corresponding to a blue color optical signal, in response to wavelengths in a blue range of the visible light range. However, the inventive concept is not limited thereto, and the plurality of pixels PX may further include white pixels PX. As another example, the plurality of pixels PX may also include a cyan pixel PX, a yellow pixel PX, a magenta pixel PX, or a white pixel PX.

The row driver 120 may generate a plurality of control signals capable of controlling operations of the pixels PX arranged on each row, according to a control by the timing controller 140. The row driver 120 may provide the plurality of control signals to each of the plurality of pixels PX of the pixel array 110 via the plurality of row lines RL. The pixel array 110 may be driven in row units, in response to the plurality of control signals provided by the row driver 120.

The pixel array 110 may output the plurality of sensing signals via the plurality of column lines CL according to a control by the row driver 120.

The ADC circuit 130 may perform an analog-digital conversion on each of the plurality of sensing signals received via the plurality of column lines CL. The ADC circuit 130 may include an ADC corresponding to each of the plurality of column lines CL, and the ADC may convert the sensing signal received via a corresponding column line CL to a pixel value. According to an operation mode of the image sensor 100, the pixel value may represent the amount of light sensed by the pixel PX.

The ADC may include a correlated double sampling (CDS) circuit for sampling and holding a received signal. The CDS circuit may perform double sampling on a noise signal and a sensing signal when the pixel PX or a shared pixel PX is reset, and output a signal corresponding to a difference between the sensing signal and the noise signal. The ADC may include a counter, and the counter may generate a pixel value by counting signals received from the CDS circuit. For example, the CDS circuit may be implemented by an operational transconductance amplifier (OTA), a differential amplifier, etc. The counter may be implemented by, for example, an up-counter and a computation circuit, an up/down counter, a bit-wise inversion counter, etc.

The timing controller 140 may generate timing control signals for controlling operations of the row driver 120 and the ADC circuit 130. The row driver 120 and the ADC circuit 130 may drive the pixel array 110 in row units, as described above, based on the timing control signals from the timing controller 140, and in addition, may convert the plurality of sensing signals received via the plurality of column lines CL to the pixel values.

The image signal processor 150 may receive a first image data IDT1, for example, unprocessed image data, from the ADC circuit 130, and perform signal processing on the first image data IDT1. The image signal processor 150 may perform signal processing such as black level compensation, lens shading compensation, crosstalk compensation, and bad pixel compensation.

Second image data IDT2, for example, signal-processed image data, output by the image signal processor 150, may be transmitted to a processor 200. The processor 200 may include a host processor of an electronic device including the image sensor 100 mounted thereon, and may include, for example, an application processor of a mobile terminal. The image sensor 100 may transmit the second image data IDT2 to the processor 200 according to a data communication method based on a certain interface, for example, a mobile industry processor interface (MIPI).

Figure 2:
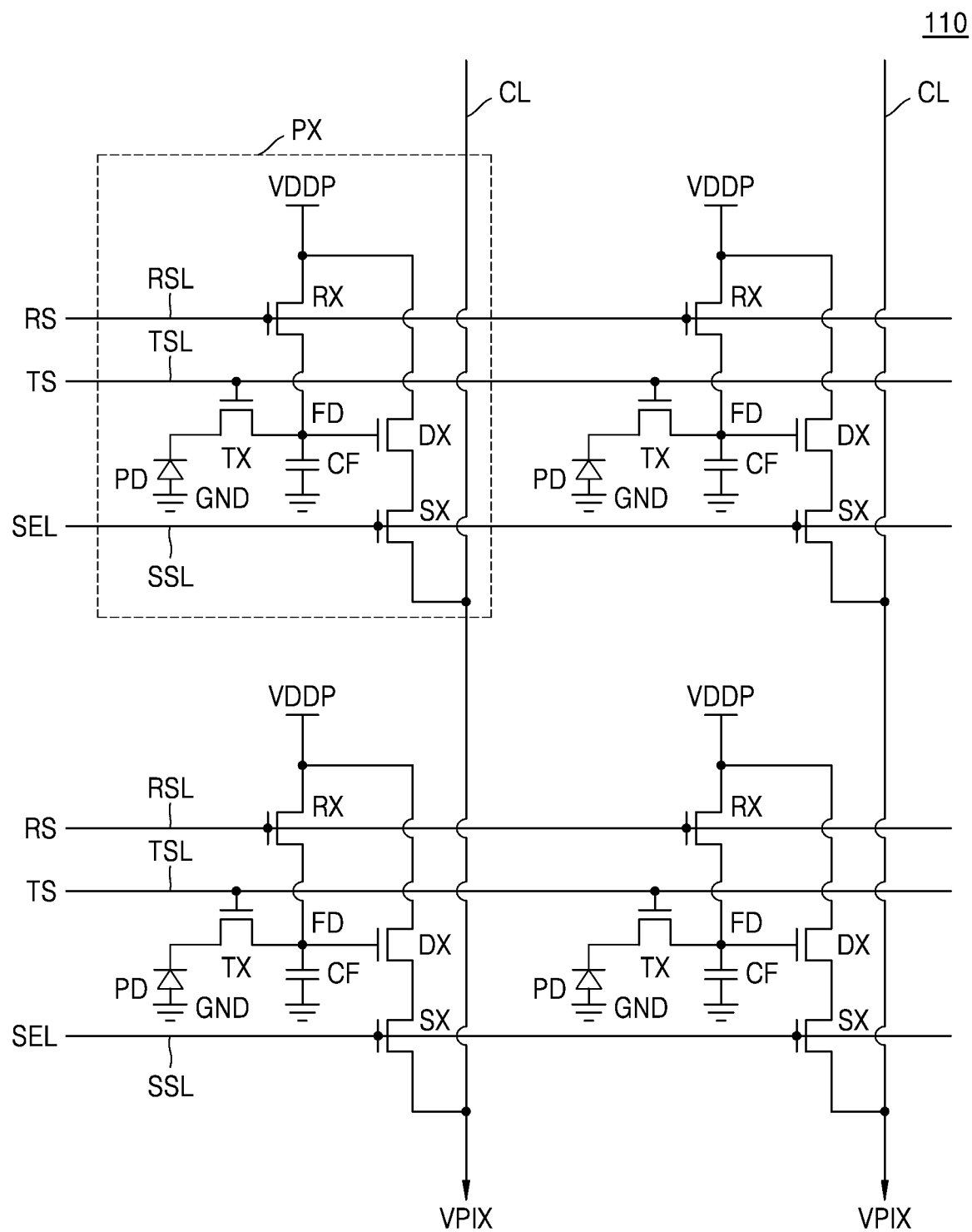
FIG. 2 is a circuit diagram for describing a unit pixel included in an image sensor, according to an example embodiment of the inventive concept.

FIG. 2 is a circuit diagram for describing a unit pixel included in an image sensor, according to an example embodiment of the inventive concept.

Referring to FIGS. 1 and 2, an active pixel sensor array 110 may include a plurality of unit pixels PX, and the unit pixels PX may be arranged in a matrix form.

According to an example embodiment of the inventive concept, the unit pixel PX may include a transmission transistor TX and logic transistors RX, SX, and DX. The logic transistors may include a reset transistor RX, a select transistor SX, and a drive transistor DX.

A photoelectric conversion element PD may generate and accumulate photocharges in proportion to the amount of light incident from the outside. The photoelectric conversion element PD may use any one of a photodiode, a phototransistor, a photogate, a pinned photodiode, and a combination thereof. When the photoelectric conversion element PD includes a photodiode, a pixel reference voltage GND may be applied to an anode of the photoelectric conversion element PD, and a source electrode of the transmission transistor TX may be connected to a cathode of the photoelectric conversion element PD.

The transmission transistor TX, the reset transistor RX, the drive transistor DX, and the select transistor SX may respectively operate in response to control signals provided by the row driver 120, for example, a reset control signal RS, a transmission control signal TS, and a select signal SEL. The reset control signal RS may be transmitted via a reset signal line RSL, the transmission control signal TS may be transmitted via a transmission control signal line TSL, and the select signal SEL may be transmitted via a select signal line SSL. The reset signal line RSL, the transmission control signal line TSL, and the select signal line SSL may constitute the row lines RL in FIG. 1.

The reset transistor RX may be turned on in response to the reset control signal RS applied to a gate terminal thereof, and reset a floating diffusion node FD based on a pixel power voltage VDDP.

The transmission transistor TX may be turned on in response to the transmission control signal TS applied to the gate terminal thereof, and transmit charges generated by the photoelectric conversion element PD to the floating diffusion node FD. A capacitor CF, for example, a parasitic capacitor, may be formed by the floating diffusion node FD, and charges transmitted may be accumulated in the capacitor CF.

The accumulated charges may be converted to a voltage. A conversion gain may be determined by capacitance of the capacitor CF of the floating diffusion node FD. A unit of the conversion gain may be, for example, uV/e. For example, the conversion gain may be inversely proportional to a magnitude of the capacitance of the capacitor CF.

The drive transistor DX may operate as a source follower buffer amplifier based on a bias current generated by a current source connected to the column line CL, and output a voltage corresponding to a voltage of the floating diffusion node FD as a pixel voltage VPIX via the select transistor SX.

The select transistor SX may select a pixel PX. The select transistor SX may be turned on in response to the select signal SEL applied to the gate terminal thereof, and output the pixel voltage VPIX (or a current) output from the drive transistor DX to the column line CL. The pixel voltage VPIX may be provided to the ADC circuit 150 via the column line CL.

Figure 3:
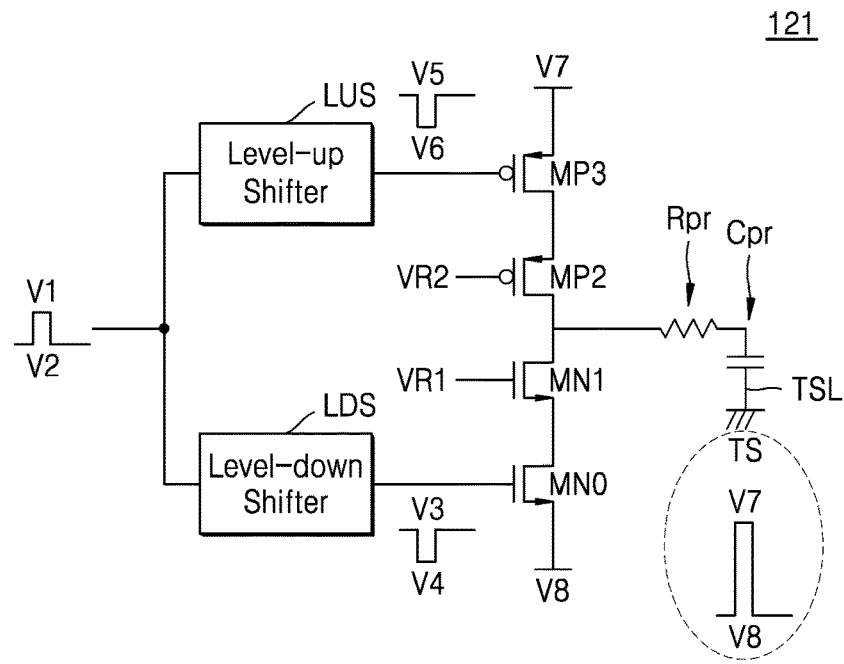
FIG. 3 is a circuit diagram of a transmission control signal generator included in a row driver in FIG. 1.

FIG. 3 is a circuit diagram of a transmission control signal generator 121 included in the row driver 120 in FIG. 1.

Referring to FIG. 3, the transmission control signal generator 121 may include a circuit for generating the transmission control signal (TS, refer to FIG. 2), which is a pulse signal changing between a seventh voltage V7 and an eighth voltage V8, based on a pulse signal changing between a first voltage V1 and a second voltage V2. The first voltage V1 may be a logic high voltage, and the second voltage V2 may be a logic low voltage.

The transmission control signal generator 121 may include a level-up shifter LUS, a level-down shifter LDS, and first, second, third, and fourth transistors MN0, MN1, MP2, and MP3. Each of the first and second transistors MN0 and MN1 may include an N-type metal-oxide-semiconductor field effect transistor (MOSFET), and each of the third and fourth transistors MP2 and MP3 may include a P-type MOSFET, but the inventive concept is not limited thereto.

The level-down shifter LDS may output a second pulse signal changing between a third voltage V3 and a fourth voltage V4, based on a first pulse signal changing between the first voltage V1 and the second voltage V2. The second pulse signal may include a signal inverted from the first pulse signal. In this case, the third voltage V3 may be less than the first voltage V1, and the fourth voltage V4 may be less than the second voltage V2.

The level-down shifter LDS may turn on or turn off the first transistor MN0, by applying the second pulse signal to a gate electrode of the first transistor MN0. Accordingly, a voltage applied to the gate electrode of the first transistor MN0 may vary with time. The eighth voltage V8 may be applied to the source electrode of the first transistor MN0. Accordingly, when the first transistor MN0 is turned on, the eighth voltage V8 may be applied to a source electrode of the second transistor MN1 via a drain electrode of the first transistor MN0.

A first resistance adjustment voltage VR1 may be applied to a gate electrode of the second transistor MN1. The first resistance adjustment voltage VR1 may be substantially constant with time. An ON resistance of the second transistor MN1 may be greater than an ON resistance of the first transistor MN0. The first resistance adjustment voltage VR1 may adjust the ON resistance of the second transistor MN1 to be in a range of about 0.5Ω to about 5 MΩ. According to an example embodiment of the inventive concept, the first resistance adjustment voltage VR1 may be different from each of the pixel power voltage (VDDP, refer to FIG. 2) and the pixel reference voltage (GND, refer to FIG. 2). According to an example embodiment of the inventive concept, the first resistance adjustment voltage VR1 may be less than the pixel power voltage (VDDP, refer to FIG. 2) and may be higher than the pixel reference voltage (GND, refer to FIG. 2). In this case, the ON resistance may be a resistance value between a drain and a source of a MOSFET in operation.

Accordingly, when the first transistor MN0 is turned on, in other words, when the first pulse signal has a second voltage V2, the eighth voltage V8 may be output to the transmission control signal line TSL via the first and second transistors MN0 and MN1. A resistor Rpr and a capacitor Cpr in FIG. 3 may include an equivalent parasitic resistor and an equivalent parasitic capacitor of the transmission control signal line TSL, respectively.

The level-up shifter LUS may output a third pulse signal changing between a fifth voltage V5 and a sixth voltage V6, based on the first pulse signal changing between the first voltage V1 and the second voltage V2. The third pulse signal may include a signal inverted from the first pulse signal. In this case, the fifth voltage V5 may be greater than the first voltage V1, and the sixth voltage V6 may be greater than the second voltage V2.

The level-up shifter LUS may turn on or off the fourth transistor MP3, by applying the third pulse signal to a gate electrode of the fourth transistor MP3. According to an example embodiment of the inventive concept, a voltage applied to the gate electrode of the fourth transistor MP3 may vary with time. The seventh voltage V7 may be applied to the source electrode of the fourth transistor MP3. Accordingly, when the fourth transistor MP3 is turned on, the seventh voltage V7 may be applied to a source electrode of the third transistor MP2 via a drain electrode of the fourth transistor MP3. According to an example embodiment of the inventive concept, a voltage difference between the seventh voltage V7 and the eighth voltage V8 may be greater than a voltage difference between the first voltage V1 and the second voltage V2.

A second resistance adjustment voltage VR2 may be applied to a gate electrode of the third transistor MP2. The second resistance adjustment voltage VR2 may be substantially constant with time. The ON resistance of the third transistor MP2 may be greater than the ON resistance of the fourth transistor MP3. The second resistance adjustment voltage VR2 may be used to adjust the ON resistance of the third transistor MP2 to be in a range of about 0.5Ω to about 5 MΩ. According to an example embodiment of the inventive concept, the second resistance adjustment voltage VR2 may be different from each of the pixel power voltage (VDDP, refer to FIG. 2) and the pixel reference voltage (GND, refer to FIG. 2). According to an example embodiment of the inventive concept, the second resistance adjustment voltage VR2 may be less than the pixel power voltage (VDDP, refer to FIG. 2), and higher than the pixel reference voltage (GND, refer to FIG. 2). According to an example embodiment of the inventive concept, the second resistance adjustment voltage VR2 may be less than the first resistance adjustment voltage VR1.

Accordingly, when the fourth transistor MP3 is turned on, (in other words, when the first pulse signal has the first voltage V1), the seventh voltage V7 may be output to the transmission control signal line TSL via the third and fourth transistors MP2 and MP3.

According to an example embodiment of the inventive concept, because the second and third transistors MN1 and MP2 have relatively higher on resistance values, the second and third transistors MN1 and MP2 may constitute a current limiter. In other words, the second and third transistors MN1 and MP2 may function as a current limiter. The transmission control signal generator 121 according to an example embodiment of the inventive concept may include the current limiter, and thus, may limit a value of a current output to the transmission control signal line TSL. In other words, the transmission control signal generator 121 may keep the value of a current output to the transmission control signal line TSL within a predetermined range. Accordingly, a rise time of the transmission control signal (TS, refer to FIG. 2) applied to the pixels (PX, refer to FIG. 1) adjacent to the row driver (120, refer to FIG. 1) may be delayed, and as to be described later with reference to FIGS. 4A through 5B, the reliability of the pixel array (110, refer to FIG. 1) and the image sensor 100 including the pixel array 110 may be increased.

In this case, the rise time may be a time required by a pulse to rise from about 10% to about 90% of the maximum value thereof. According to an example embodiment of the inventive concept, the rise time of the transmission control signal TS applied to the pixels (PX, refer to FIG. 1) closest to the row driver (120, refer to FIG. 1) may be in a range of about 1 ns to about 500 ns. According to an example embodiment of the inventive concept, a slope of the rise time of the transmission control signal (TS, refer to FIG. 2) applied to the pixels (PX, refer to FIG. 1) closest to the row driver (120, refer to FIG. 1) may be in a range of about ⅕ [%/ns] to about 500 [%/ns].

Figure 4A:
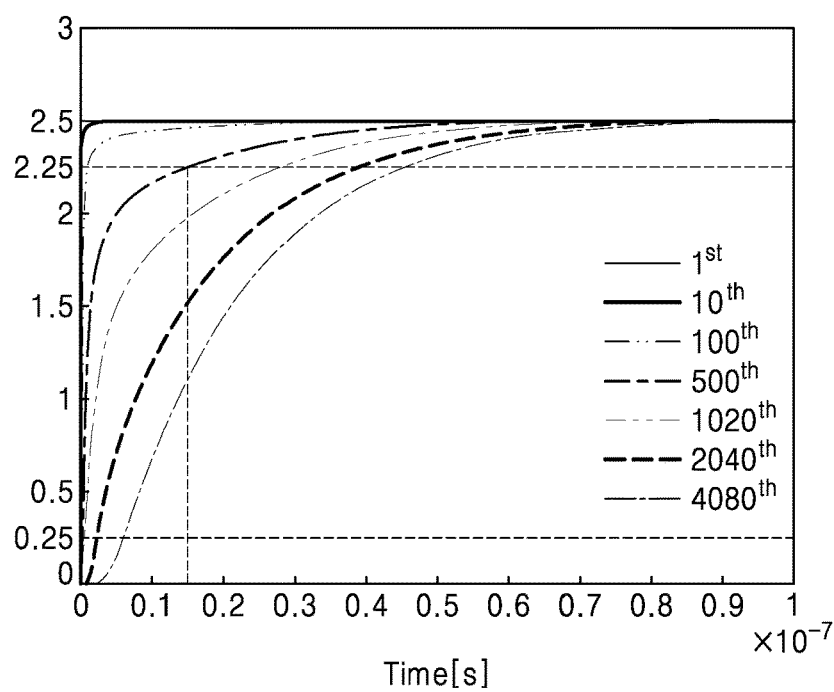
FIG. 4A is a graph showing a rise time of a transmission control signal per pixel according to a distance from a row driver in an image sensor according to the related art.

FIG. 4A is a graph of a rise time of a transmission control signal per pixel according to a distance from a row driver in an image sensor according to the related art. In FIG. 4A, the longitudinal axis represents a time axis in a unit of seconds, and the vertical axis represents a standardized voltage.

Referring to FIG. 4A, it can be seen that a transmission control signal of a pixel closest to a row driver has a voltage-time profile substantially similar to a square wave. Accordingly, it can be seen that a transmission signal applied to the pixels relatively close to the row driver has a very short rise time.

Figure 4B:
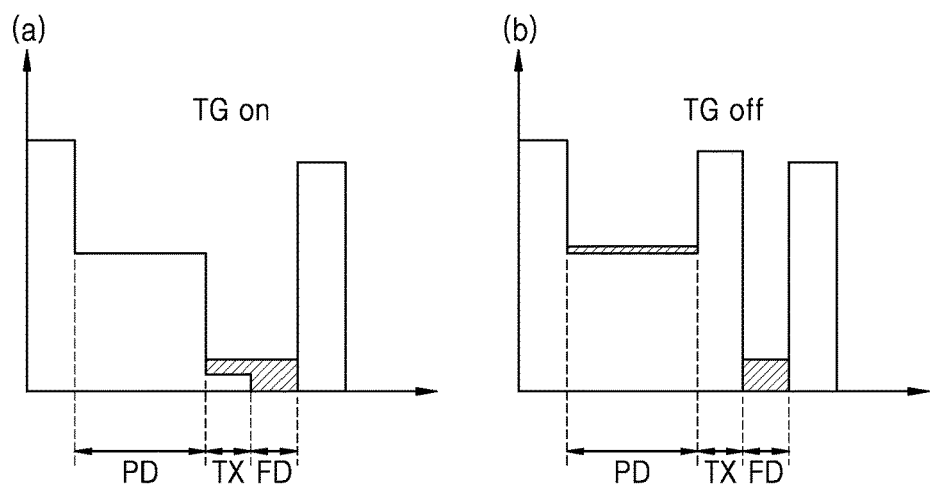
FIG. 4B illustrates schematic graphs for describing movements of photocharges when the rise time is short.

FIG. 4B shows schematic graphs for describing movements of photocharges when the rise time is short. In FIG. 4B, the horizontal axis may represent nodes on a pixel, and the vertical axis may represent a relative voltage.

A graph (a) in FIG. 4B illustrates that charges generated by a photodiode PD are stored at a floating diffusion node FD due to turning on a transmission transistor TX. When the transmission transistor TX is turned on, some of the charges generated by the photodiode PD may also be stored in the transmission transistor TX.

A graph (b) in FIG. 4B illustrates a movement of the charges stored in the transmission transistor TX due to turning off a transistor TG. Some of the charges may be stored in the transmission transistor TX at the turn-on of the transmission transistor TX. When the rise time of the transmission control signal is excessively short, some of the charges stored in the transmission transistor TX may be moved to the photodiode PD. In this case, because charges with an amount less than an amount of charges generated by the photoelectric conversion element are read out via a column line, the reliability of a pixel signal is reduced.

In particular, as described with reference to FIG. 4A, because a transmission control signal having a relatively short rise time is applied to pixels adjacent to the row driver, and the reliability of signals of pixels adjacent to the row driver was reduced.

Figure 5A:
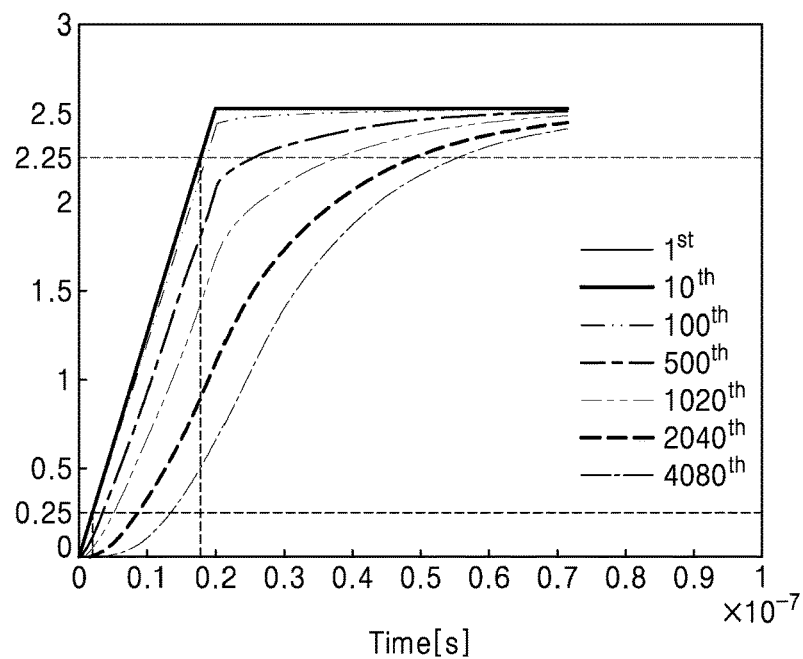
FIG. 5A is a graph showing effects according to example embodiments of the inventive concept.

FIG. 5A is a graph showing effects according to an example embodiment of the inventive concept. In FIG. 5A, the longitudinal axis may represent a time axis in a unit of seconds, and the vertical axis may represent a standardized voltage.

Referring to FIGS. 1 and 5A, the rise time of a transmission control signal of a pixel closest to the row driver 120 has been identified as about 16 ns. This result is similar to a rise time of a pixel that is about a 500th closest pixel from the row driver in an image sensor according to the related art, and may not cause image deterioration.

Figure 5B:
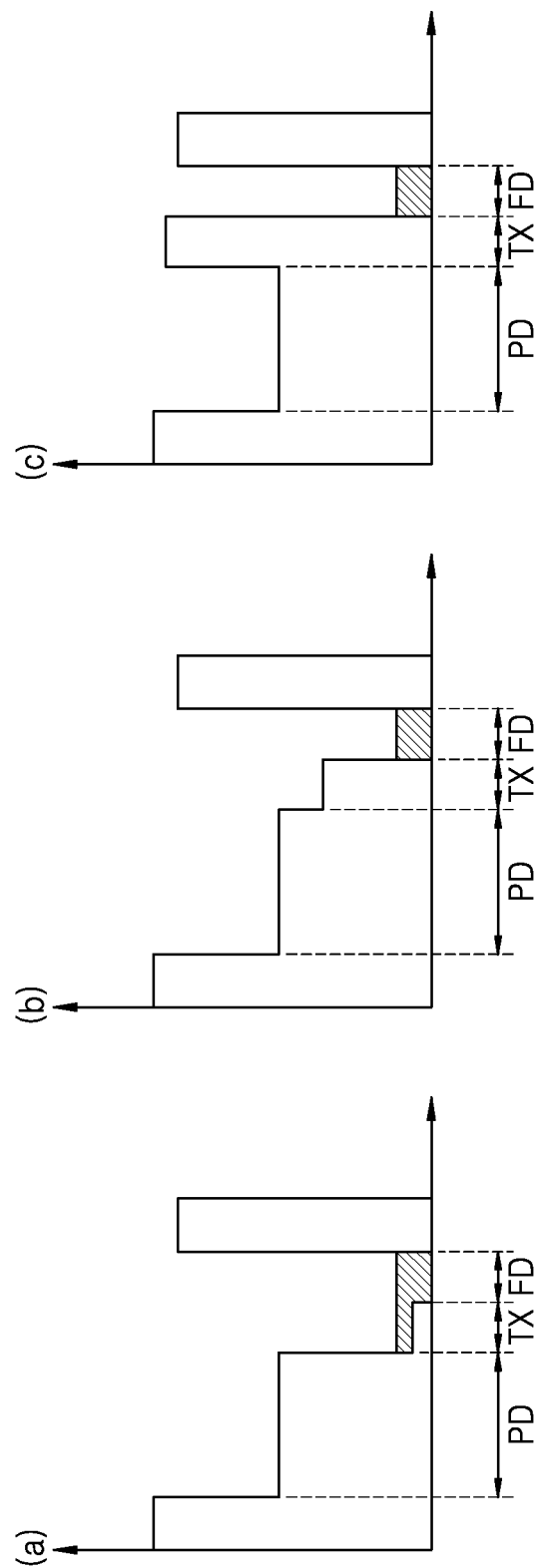
FIG. 5B illustrates schematic graphs of movements of photocharges when the rise time is sufficient.

FIG. 5B illustrates schematic graphs of movements of photocharges when the rise time is sufficient. A graph (a) in FIG. 5B illustrates a time point immediately after charges are stored at the floating diffusion node FD, and graphs (b) and (c) in FIG. 5B illustrate flow of charges in a process in which a transmit gate is turned off. In FIG. 5B, the horizontal axis may represent nodes on a pixel, and the vertical axis may represent a relative voltage.

Referring to FIG. 5B, when a rise time of a transmission control signal is sufficiently large as illustrated in FIG. 5A (for example, about 1 ns to about 500 ns), the charges stored in the transmit gate may be moved to the floating diffusion node FD due to a potential difference in a process in which a potential of the transmit gate is gradually increased, and thus, the reliability of the pixel signal may be increased.

Figure 6:
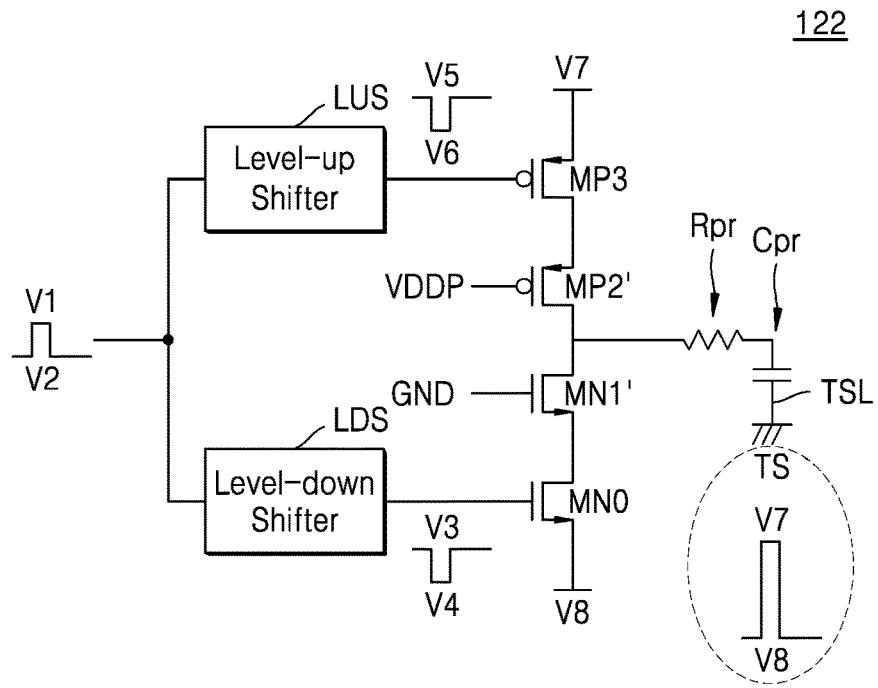
FIG. 6 is a circuit diagram of a transmission control signal generator according to an example embodiment of the inventive concept.

FIG. 6 is a circuit diagram of a transmission control signal generator 122 according to an example embodiment of the inventive concept.

For convenience of description, duplicate descriptions given with reference to FIG. 3 are omitted and differences are mainly described.

Referring to FIG. 6, the transmission control signal generator 122 may include a circuit for generating the transmission control signal (TS, refer to FIG. 2), which is a pulse signal changing between the seventh voltage V7 and the eighth voltage V8, based on a pulse signal changing between the first voltage V1 and the second voltage V2.

The transmission control signal generator 122 may include the level-up shifter LUS, the level-down shifter LDS, and first, second, third, and fourth transistors MN0, MN1', MP2', and MP3'. Each of the first and second transistors MN0 and MN1' may include a N-type MOSFET, and each of the third and fourth transistors MP2' and MP3' may include a P-type MOSFET, but the inventive concept is not limited thereto.

According to an example embodiment of the inventive concept, a voltage applied to a gate electrode of the second transistor MN1' may be the pixel power voltage VDDP, and a voltage applied to a gate electrode of the third transistor MP2' may be the pixel reference voltage GND.

According to an example embodiment of the inventive concept, an ON resistance of the first transistor MN0 may be different from an ON resistance of the second transistor MN1'. According to an example embodiment of the inventive concept, the ON resistance of the second transistor MN1' may be greater than the ON resistance of the first transistor MN0.

The first transistor MN0 and the second transistor MN1' may differ from each other in at least one of a size, a channel doping concentration, a body doping concentration, a thickness of a gate oxide, a gate doping, and a gate material layer composition.

As an example, a geometric dimension of the second transistor MN1' may be less than a geometric dimension of the first transistor MN0. At least any one of a channel length (in other words, a distance between a source and a drain) and a channel width (e.g., a width in a direction perpendicular to a channel length direction) of the second transistor MN1' may be less than any corresponding one of a channel length and a channel width of the first transistor MN0. For example, the channel length of the second transistor MN1' may be less than the channel length of the first transistor MN0. As another example, the channel width of the second transistor MN1' may be less than the channel width of the first transistor MN0.

In another example embodiment of the inventive concept, a channel doping concentration of the second transistor MN1' may be less than a channel doping concentration of the first transistor MN0. In another example embodiment of the inventive concept, a body doping concentration (in other words, a P-type well doping concentration) of the second transistor MN1' may be greater than a body doping concentration of the first transistor MN0.

In another example embodiment of the inventive concept, a gate oxide thickness of the second transistor MN1' may be less than a gate oxide thickness of the first transistor MN0. In another example embodiment of the inventive concept, a doping concentration of polysilicon constituting the gate electrode of the second transistor MN1' may be different from a doping concentration of polysilicon constituting the gate electrode of the first transistor MN0.

In another example embodiment of the inventive concept, a material constituting the gate electrode of the second transistor MN1' may be different from a material constituting the gate electrode of the first transistor MN0. For example, any one of the gate electrode of the first transistor MN0 and the gate electrode of the second transistor MN1' may include doped polysilicon, and the other may include a metal material such as Ti, W, Al, and Cu.

According to an example embodiment of the inventive concept, an ON resistance of the fourth transistor MP3 may be different from an ON resistance of the third transistor MP2'. According to an example embodiment of the inventive concept, the ON resistance of the third transistor MP2' may be greater than the ON resistance of the fourth transistor MP3.

The fourth transistor MP3 and the third transistor MP2' may differ from each other in at least one of a size, channel doping concentration, body doping concentration, a thickness of a gate oxide, gate doping, and gate material layer composition.

As an example, a geometric dimension of the third transistor MP2' may be less than a geometric dimension of the fourth transistor MP3. At least any one of the channel length and the channel width of the third transistor MP2' may be less than any corresponding one of the channel length and the channel width of the fourth transistor MP3. As an example, the channel length of the third transistor MP2' may be less than the channel length of the fourth transistor MP3. As another example, the channel width of the third transistor MP2' may be less than the channel width of the fourth transistor MP3.

In another example embodiment of the inventive concept, a channel doping concentration of the third transistor MP2' may be less than channel a doping concentration of the fourth transistor MP3. In another example embodiment of the inventive concept, a body doping concentration (in other words, a P-type well doping concentration) of the third transistor MP2' may be greater than a body doping concentration of the fourth transistor MP3.

In another example embodiment of the inventive concept, a thickness of a gate oxide of the third transistor MP2' may be less than a thickness of a gate oxide of the fourth transistor MP3. In another example embodiment of the inventive concept, a doping concentration of polysilicon constituting the gate electrode of the third transistor MP2' may be different from a doping concentration of polysilicon constituting the gate electrode of the fourth transistor MP3.

In another example embodiment of the inventive concept, a material constituting the gate electrode of the third transistor MP2' may be different from a material constituting the gate electrode of the fourth transistor MP3. For example, any one of the gate electrode of the fourth transistor MP3 and the gate electrode of the third transistor MP2' may include doped polysilicon, and the other may include a metal material such as Ti, W, Al, and Cu.

According to an example embodiment of the inventive concept, because the second and third transistors MN1' and MP2' have relatively higher on resistance values, the second and third transistors MN1' and MP2' may constitute a current limiter. In other words, the second and third transistors MN1' and MP2' may function as a current limiter. Accordingly, the rise time of the control signal TS may be in a range of about 1 ns to about 500 ns, and the reliability of the image sensor (100, refer to FIG. 1) may be increased.

Figure 7:
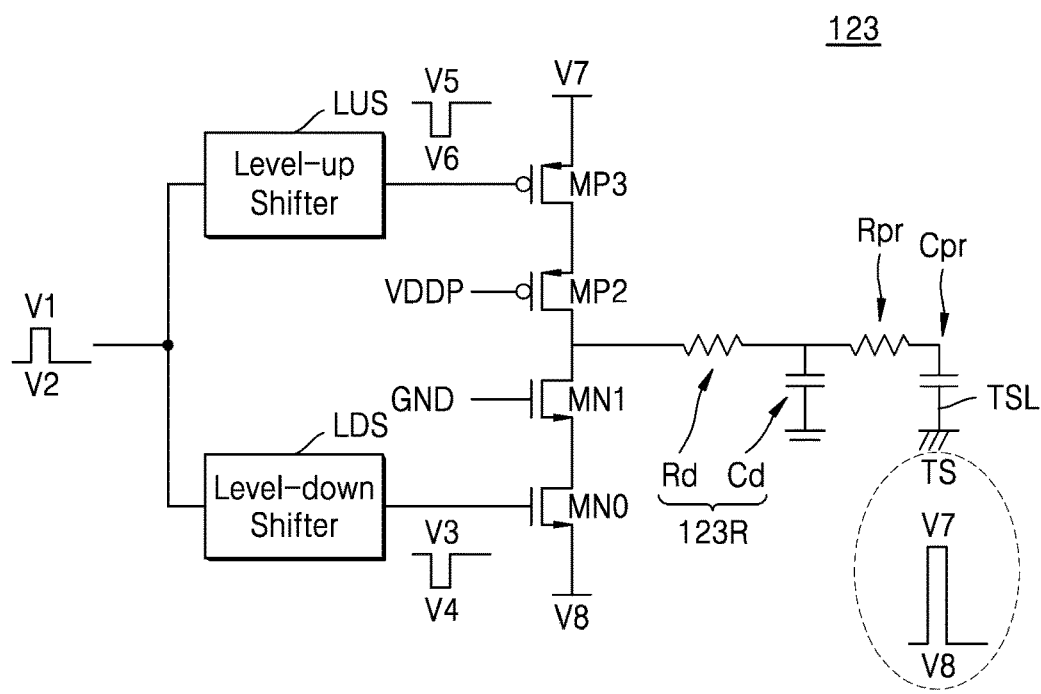
FIG. 7 is a circuit diagram of a transmission control signal generator according to an example embodiment of the inventive concept.

FIG. 7 is a circuit diagram of a transmission control signal generator 123 according to an example embodiment of the inventive concept.

For convenience of description, duplicate descriptions given with reference to FIG. 3 are omitted and differences are mainly described.

Referring to FIG. 7, the transmission control signal generator 123 may include a circuit for generating the transmission control signal (TS, refer to FIG. 2), which is a pulse signal changing between the seventh voltage V7 and the eighth voltage V8, based on a pulse signal changing between the first voltage V1 and the second voltage V2.

The transmission control signal generator 123 may include a level-up shifter LUS, a level-down shifter LDS, and the first, second, third, and fourth transistors MN0, MN1, MP2, and MP3. Unlike as illustrated in FIG. 3, the pixel power voltage VDDP may be applied to the gate electrode of the second transistor MN1, and the pixel reference voltage GND may be applied to the gate electrode of the third transistor MP2.

The transmission control signal generator 123 may further include a delay circuit. The delay circuit 123R may include an RC bridge including a delay resistor Rd and a delay capacitor Cd. A first terminal of the delay resistor Rd may be connected to a drain electrode of the second transistor MN1 and a drain electrode of the third transistor MP2, and a second terminal of the delay resistor Rd may be connected to the transmission control signal line TSL. A first terminal of the delay capacitor Cd may be connected to the second terminal of the delay resistor Rd, and the pixel reference voltage GND may be applied to a second terminal of the delay capacitor Cd.

The delay capacitor Cd may be provided by arranging a large facing area between the transmission control signal line TSL and a wiring adjacent thereto. The delay capacitor Cd may be implemented by, for example, a comb structure in which the plurality of reset signal lines (RSL, refer to FIG. 2) between each of the plurality of transmission control signal lines TSL extending in a first direction extend in a second direction oblique to the first direction. The delay resistor Rd may be provided by, for example, inserting a doped semiconductor material into the transmission control signal line TSL.

According to an example embodiment of the inventive concept, the transmission control signal generator 123 may include the RC bridge connected to the transmission control signal line TSL, which is an output terminal, and thus, the rise time of the control signal TS may be in a range of about 1 ns to about 500 ns due to RC delay. Accordingly, the reliability of the image sensor (100, refer to FIG. 1) may be increased.

Figure 8:
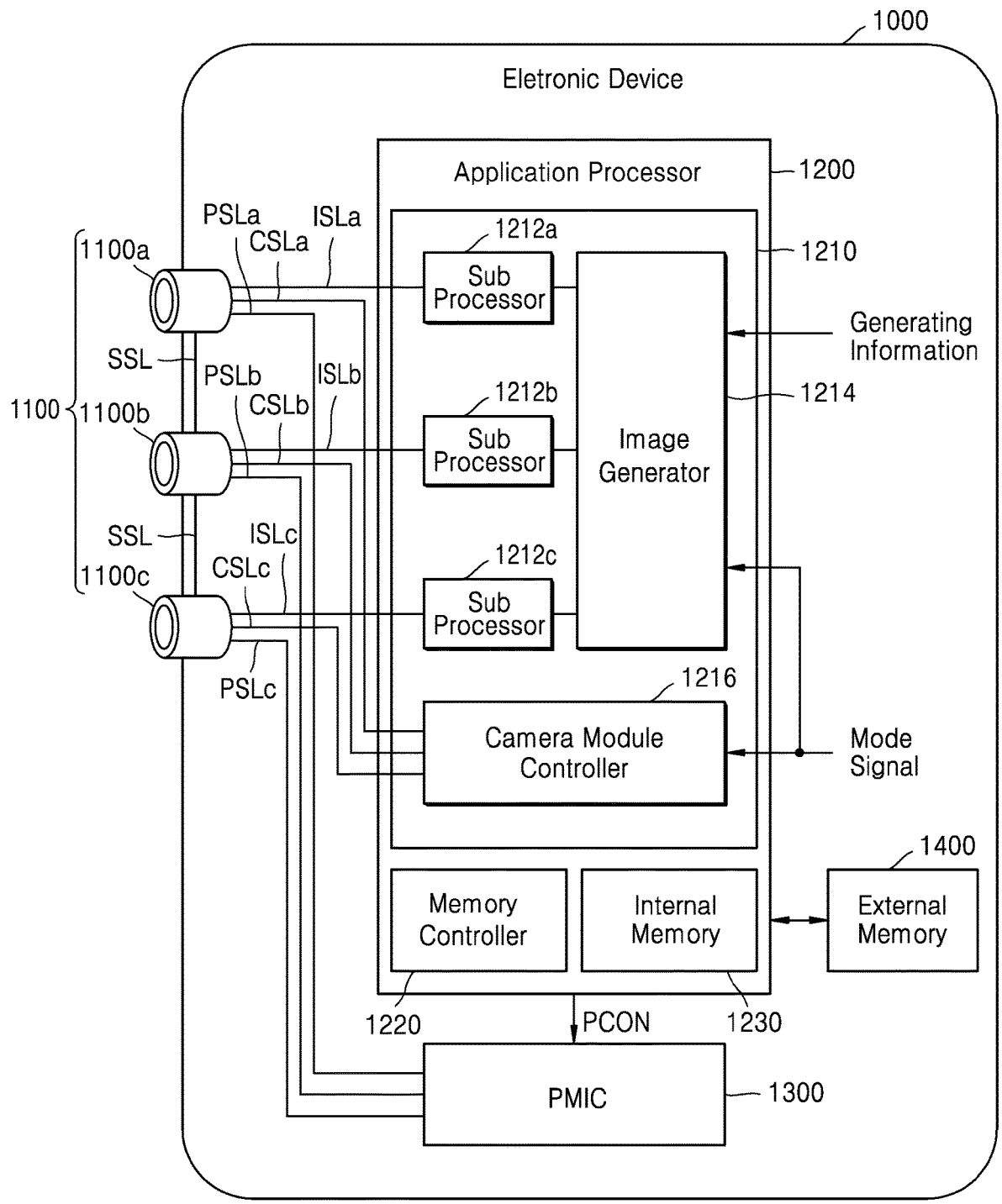
FIG. 8 is a block diagram of an electronic device including a multi-camera module.
Figure 9:
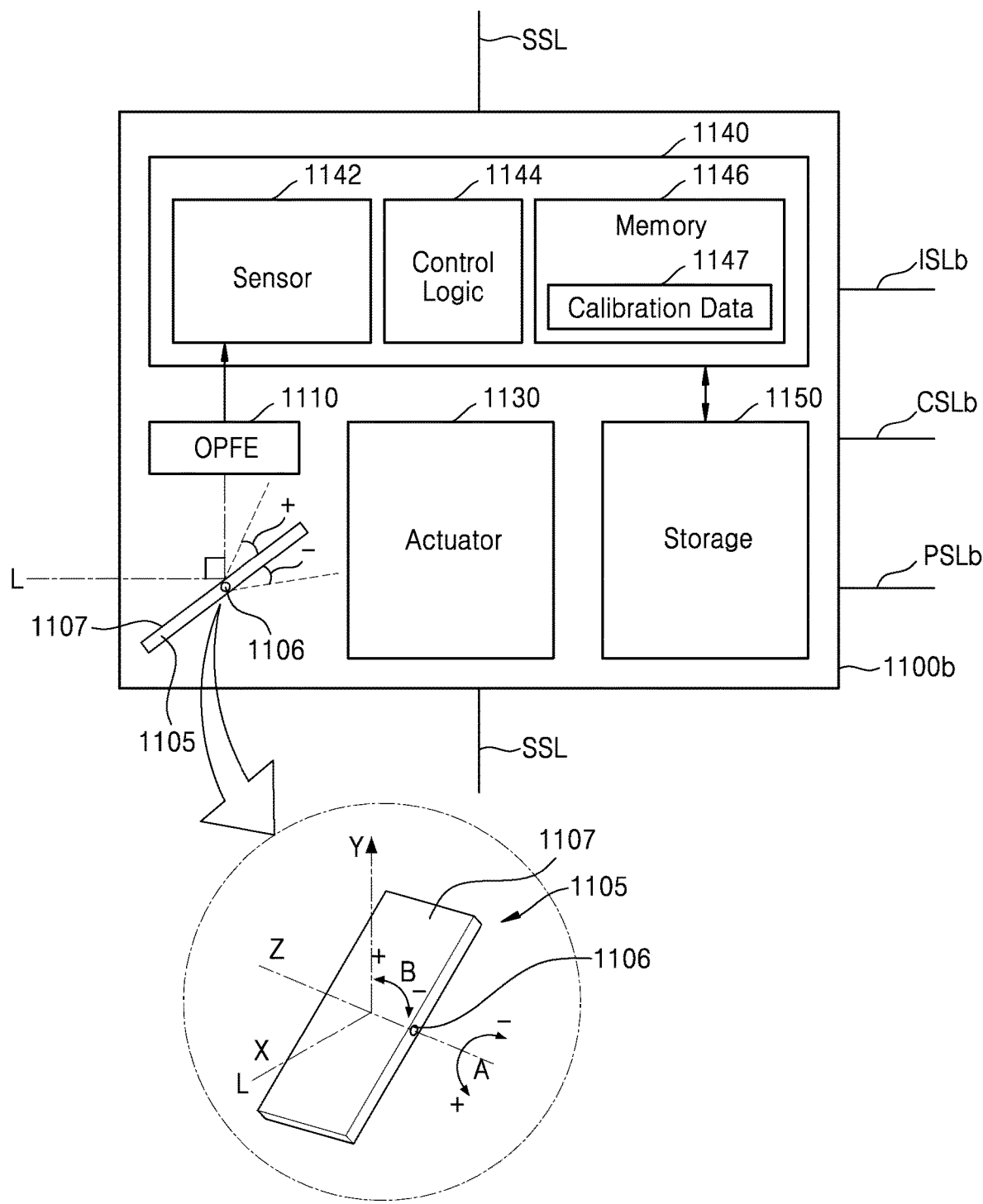
FIG. 9 is a detailed block diagram of a camera module in FIG. 8.

FIG. 8 is a block diagram of an electronic device 1000 including a multi-camera module. FIG. 9 is a detailed block diagram of a camera module in FIG. 8.

Referring to FIG. 8, the electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. Although FIG. 8 illustrates an embodiment in which three camera modules 1100a, 1100b, and 1100c are arranged, the inventive concept is not limited thereto. For example, the camera module group 1100 may include only two camera modules, or may be modified and include n (n is a natural number equal to or greater than 4) camera modules.

Hereinafter, referring to FIG. 9, a detailed configuration of the camera module 1100b will be described, but the descriptions below may be identically applied to the other camera modules 1100a and 1100c.

Referring to FIG. 9, the camera module 1100b may include a prism 1105, an optical path folding element (hereinafter, referred to as OPFE) 1110, an actuator 1130, an image sensing device 1140, and a storage 1150.

The prism 1105 may change a path of light L incident from the outside by including a reflective surface 1107 of a light reflecting material.

In an example embodiment of the inventive concept, the prism 1105 may change a path of light L incident in a first direction X to a second direction Y perpendicular to the first direction X. In addition, the prism 1105 may rotate the reflective surface 1107 of the light reflecting material to a direction A with a center axis 1106 as a center, or change the path of the light L incident in the first direction X to the second direction Y by rotating the center axis 1106 to a direction B. In this case, the OPFE 1110 may also be moved to a third direction Z perpendicular to the first direction X and the second direction Y.

In an example embodiment of the inventive concept, as illustrated in FIG. 9, the maximum rotation angle in the direction A of the prism 1105 may be equal to or less than about 15 degrees in a plus (+) direction A, and greater than about 15 degrees in a minus (−) direction A, but the inventive concept is not limited thereto.

In an example embodiment of the inventive concept, the prism 1105 may be moved within about 20 degrees, or between about 10 degrees and about 20 degrees, or between about 15 degrees and about 20 degrees in a plus (+) or minus (−) direction B, and in this case, the movement degrees may be the same degrees in the plus (+) or the minus (−) direction B, or almost similar degrees thereto within a range of about 1 degree.

In an example embodiment of the inventive concept, the prism 1105 may move the reflecting surface 1107 to a third direction (for example, the Z direction) in parallel with an extending direction of the center axis 1106.

In an example embodiment of the inventive concept, the camera module 1100b may include two or more prisms, and the path of the light L incident in the first direction X through these prisms may be variously changed, such as to the second direction Y perpendicular to the first direction X and back to the first direction X, or to the third direction Z and back to the second direction Y.

The OPFE 1110 may include, for example, an optical lens including m (m is a natural number) groups. The m lenses may move in the second direction Y and change an optical zoom ratio of the camera module 1100b. For example, when a basic optical zoom ratio of the camera module 1100b is defined as Z, and m optical lenses included in the OPFE 1110 are moved, the optical zoom ratio of the camera module 1100b may be changed to an optical zoom ratio of 3Z, 5Z, or 5Z or more.

The actuator 1130 may move the OPFE 1110 or the optical lens (hereinafter, referred to as an optical lens) to a certain position. For example, the actuator 1130 may adjust a location of the optical lens so that an image sensor 1142 is positioned at a focal length of the optical lens for accurate sensing.

The image sensing device 1140 may include the image sensor 1142, a control logic 1144, and a memory 1146. The image sensor 1142 may sense an image of a sensing object by using the light L provided through the optical lens. The control logic 1144 may control all operations of the camera module 1100*b* and process a sensed image. For example, the control logic 1144 may control an operation of the camera module 1100*b* according to a control signal provided via a control signal line CSLb, and may extract image data corresponding to a particular image from the sensed image (for example, a face, an arm, a leg, or the like of a person in the image).

In an example embodiment of the inventive concept, the control logic 1144 may perform image processing such as encoding, noise reduction, or the like of the sensed image.

The memory 1146 may store information required for operations of the camera module 1100*b* such as calibration data 1147. The calibration data 1147 may include information required for generating the image data by using the light L provided from the outside of the camera module 1100*b*, and may include information, for example, information about a degree of rotation, information about the focal length, information about an optical axis, etc. When the camera module 1100*b* is implemented in a multi-state camera type in which the focal length varies according to a position of the optical lens, the calibration data 1147 may include information about a focal length value per position (or per state) of the optical lens and auto-focusing.

The storage 1150 may store the image data sensed by the image sensor 1142. The storage 1150 may be arranged outside the image sensing device 1140, and may be implemented in a stacked form with a sensor chip constituting the image sensing device 1140. In an example embodiment of the inventive concept, the image sensor 1142 may include a first chip, and the control logic 1144, the storage 1150, and the memory 1146 may include a second chip, and accordingly, the image sensor 1142 may be implemented in a two chip-stacked form.

In an example embodiment of the inventive concept, the storage 1150 may be implemented as electrically erasable programmable read-only memory (EEPROM), but the inventive concept is not limited thereto. In an example embodiment of the inventive concept, the image sensor 1142 may be configured in a pixel array, and the control logic 1144 may include an analog to digital converter and an image signal processor for processing the sensed image.

Referring to FIGS. 8 and 9 together, in an example embodiment of the inventive concept, each of the plurality of camera modules 1100*a*, 1100*b*, and 1100*c* may include the actuator 1130. Accordingly, each of the plurality of camera modules 1100*a*, 1100*b*, and 1100*c* may include identical or different calibration data 1147, according to an operation of the actuator 1130 included therein.

In an example embodiment of the inventive concept, one camera module (for example, 1100*b*) of the plurality of camera modules 1100*a*, 1100*b*, and 1100*c* may include a folded lens-type camera module including the prism 1105 and the OPFE 1110 described above, and the other camera modules (for example, 1100*a* and 1100*c*) may include a vertical-type camera module in which the prism 1105 and the OPFE 1110 are not included, but the inventive concept is not limited thereto.

In an example embodiment of the inventive concept, one camera module (for example, 1100*c*) of the plurality of camera modules 1100*a*, 1100*b*, and 1100*c* may include a vertical-type depth camera in which depth information is extracted by using, for example, an infrared ray (IR). In this case, the application processor 1200 may generate a three-dimensional (3D) depth image by merging image data provided by the depth camera with image data provided by another camera module (for example, 1100*a* or 1100*b*).

In an example embodiment of the inventive concept, at least two camera modules (for example, 1100*a* and 1100*b*) of the plurality of camera modules 1100*a*, 1100*b*, and 1100*c* may have different fields of view from each other. In this case, for example, the optical lenses of at least two camera modules (for example, 1100*a* and 1100*b*) of the plurality of camera modules 1100*a*, 1100*b*, and 1100*c* may be different from each other, but the inventive concept is not limited thereto.

In addition, in an example embodiment of the inventive concept, the field of view of each of the plurality of camera modules 1100*a*, 1100*b*, and 1100*c* may be different from each other. For example, the camera module 1100*a* may include an ultrawide camera, the camera module 1100*b* may include a wide camera, and the camera module 1100*c* may include a tele camera, but the inventive concept is not limited thereto. In this case, the optical lenses included in each of the plurality of camera modules 1100*a*, 1100*b*, and 1100*c* may also be different from each other, but the inventive concept is not limited thereto.

In an example embodiment of the inventive concept, each of the plurality of camera modules 1100*a*, 1100*b*, and 1100*c* may be arranged physically apart from each other. In other words, a sensing area of one image sensor 1142 may not be divided and used by the plurality of camera modules 1100*a*, 1100*b*, and 1100*c*, but the image sensor 1142, which is independent, may be arranged inside each of the plurality of camera modules 1100*a*, 1100*b*, and 1100*c*.

Referring again to FIG. 8, the application processor 1200 may include an image processing device 1210, a memory controller 1220, and an internal memory 1230. The application processor 1200 and the plurality of camera modules 1100*a*, 1100*b*, and 1100*c* may be separated from each other and implemented as, for example, separate semiconductor chips.

The image processing device 1210 may include a plurality of sub-image processors 1212*a*, 1212*b*, and 1212*c*, an image generator 1214, and a camera module controller 1216.

The image processing device 1210 may include the plurality of sub-image processors 1212*a*, 1212*b*, and 1212*c* in a number corresponding to the number of camera modules 1100*a*, 1100*b*, and 1100*c*.

The image data generated by the camera module 1100*a* may be provided to the sub-image processor 1212*a* via an image signal line ISLa, the image data generated by the camera module 1100*b* may be provided to the sub-image processor 1212*b* via an image signal line ISLb, and the image data generated by the camera module 1100*c* may be provided to the sub-image processor 1212*c* via an image signal line ISLc. Image data transmission in this manner may be performed by using, for example, a camera serial interface (CSI) based on MIPI, but the inventive concept is not limited thereto.

On the other hand, in an example embodiment of the inventive concept, one sub-image processor may be arranged to correspond to a plurality of camera modules. For example, the sub-image processor 1212*a* and the sub-image processor 1212*c* may not be implemented separate from each other as illustrated but may be implemented as being integrated into one sub-image processor. In this case, the image data provided by the camera module 1100*a* and the camera module 1100*c* may, after being selected by a select element (for example, a multiplexer), be provided to the integrated sub-image processor. Thus, the sub-image processor 1212b may not be integrated, but may receive the image data from the camera module 1100b.

In addition, the image data processed by the sub-image processor 1212b may be directly provided to the image generator 1214, but the image data processed by the sub-image processor 1212a and the sub-image processor 1212c may, after any one of them is selected by a select element (for example, a multiplexer), be provided to the image generator 1214.

Each of the sub-image processors 1212a, 1212b, and 1212c may perform image processing, such as bad pixel correction, auto-focus correction, auto-white balance, and auto-exposure (e.g., 3D adjustments), noise reduction, sharpening, gamma control, and remosaic, on the image data provided by the plurality of camera modules 1100a, 1100b, and 1100c.

In an example embodiment of the inventive concept, the remosaic signal processing may, after being performed by each of the camera modules 1100a, 1100b, and 1100c, be provided to the sub-image processors 1212a, 1212b, and 1212c.

The image data processed by each of the sub-image processors 1212a, 1212b, and 1212c may be provided to the image generator 1214. The image generator 1214 may generate an output image by using the image data provided by each of the sub-image processors 1212a, 1212b, and 1212c according to image generating information or a mode signal.

The image generator 1214 may, according to the image generating information or the mode signal, generate the output image by merging at least portions of the image data generated by the sub-image processors 1212a, 1212b, and 1212c. In addition, the image generator 1214 may, according to the image generating information or the mode signal, generate the output image by selecting any one of the image data generated by the sub-image processors 1212a, 1212b, and 1212c.

In an example embodiment of the inventive concept, the image generating information may include a zoom signal or zoom factor. In addition, in an example embodiment of the inventive concept, the mode signal may include, for example, a signal based on a mode selected by a user.

When the image generating information includes the zoom signal (e.g., a zoom factor), and each of the camera modules 1100a, 1100b, and 1100c has different fields of view from another, the image generator 1214 may perform different operations according to a type of the zoom signal. For example, when the zoom signal includes a first signal, the output image may be generated by using the image data output by the sub-image processor 1212a and the image data output by the sub-image processor 1212b, of the image data output by the sub-image processor 1212a and the image data output by the sub-image processor 1212c. When the zoom signal includes a second signal different from the first signal, the image generator 1214 may generate the output image, by using the image data output by the sub-image processor 1212c and the image data output from the sub-image processor 1212b, of the image data output by the sub-image processor 1212a and the image data output by the sub-image processor 1212c. When the zoom signal includes a third signal different from the first signal and the second signal, the image generator 1214 may not perform the image data merging, but may generate the output image by selecting any one of the image data output by each of the sub-image processors 1212a, 1212b, and 1212c. However, the inventive concept not limited thereto, and a method of processing the image data may be modified and performed as necessary.

Figure 10:
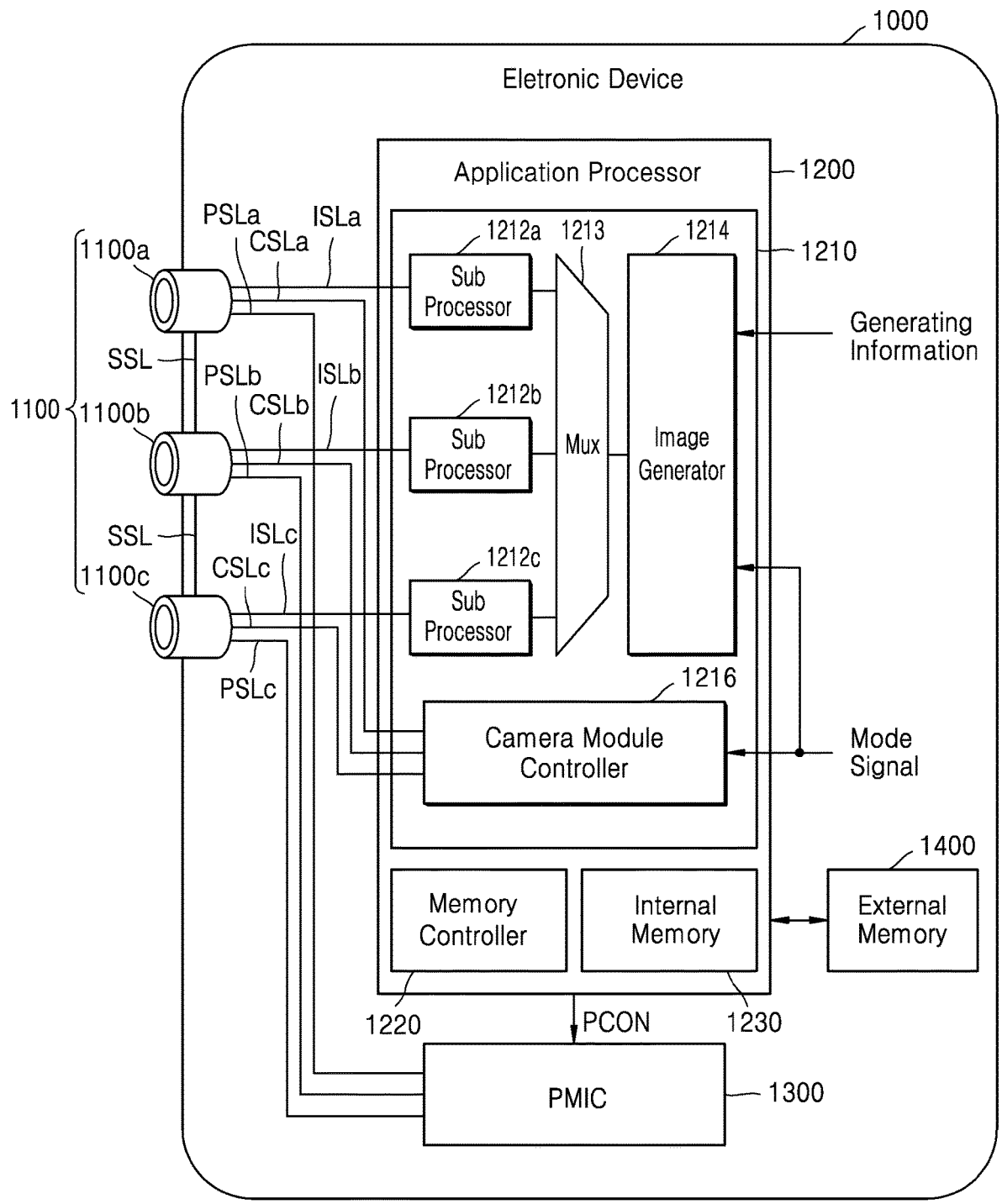
FIG. 10 is a block diagram of an electronic device including a multi-camera module, according to an example embodiment of the inventive concept.

FIG. 10 is a block diagram of an electronic device including a multi-camera module, according to an example embodiment of the inventive concept.

Referring to FIG. 10, in an example embodiment of the inventive concept, the image processing device 1210 may further include a selector 1213 that selects the output from the sub-image processors 1212a, 1212b, and 1212c and transmits the selected output to the image generator 1214.

In this case, the selector 1213 may perform different operations according to the zoom signal or zoom factor. For example, when the zoom signal includes a fourth signal (for example, the zoom ratio is a first ratio), the selector 1213 may select any one of the outputs from the sub-image processors 1212a, 1212b, and 1212c and transmit the selected output to the image generator 1214.

In addition, when the zoom signal includes a fifth signal that is different from the fourth signal (for example, the zoom ratio is a second ratio), the selector 1213 may sequentially transmit, to the image generator 1214, p (p is a natural number equal to or greater than 2) outputs of the outputs from the sub-image processors 1212a, 1212b, and 1212c. For example, the selector 1213 may sequentially transmit the output from the sub-image processor 1212b and the output from the sub-image processor 1212c to the image generator 1214. In addition, the selector 1213 may sequentially transmit the output from the sub-image processor 1212a and the output from the sub-image processor 1212b to the image generator 1214. The image generator 1214 may generate one output image by merging p outputs that have been sequentially provided.

In this case, the image processing, such as demosaic, down scaling to a video/preview resolution size, gamma compensation, and high dynamic range (HDR) processing, may be performed in advance by the sub-image processors 1212a, 1212b, and 1212c, and then, the processed image data may be transmitted to the image generator 1214. Accordingly, although the processed image data is provided to the image generator 1214 as one signal line via the selector 1213, the image merging operation of the image generator 1214 may be performed at a high speed.

In an example embodiment of the inventive concept, by receiving a plurality of pieces of image data having different exposure times from each other from at least one of the sub-image processors 1212a, 1212b, and 1212c, and performing HDR processing on the plurality of pieces of image data, the image generator 1214 may generate the merged image data with an increased dynamic range.

The camera module controller 1216 may provide a control signal to each of the camera modules 1100a, 1100b, and 1100c. The control signal generated by the camera module controller 1216 may be provided to the corresponding camera modules 1100a, 1100b, and 1100c via control signal lines CSLa, CSLb, and CSLc, which are separated from each other, respectively.

Any one (for example, 1100b) of the plurality of camera modules 1100a, 1100b, and 1100c may be designated as a master camera according to the image generating information including the zoom signal or the mode signal, and the other camera modules (for example, 1100a and 1100c) may be designated as slave cameras. This piece of information may be included in the control signal, and may be provided to the corresponding camera modules 1100a, 1100b, and 1100c via the control signal lines CSL1, CSLb, and CSLc, which are separated from each other, respectively.

According to the zoom factor or an operation mode signal, camera modules operating as the master camera and the slave cameras may be changed. For example, when the field of view of the camera module 1100a is wider than that of the camera module 1100b, and indicates a zoom ratio with a low zoom factor, the camera module 1100a may operate as the master camera, and the camera module 1100b may operate as the slave camera. To the contrary, when the zoom factor indicates a high zoom ratio, the camera module 1100b may operate as the master camera, and the camera module 1100a may operate as the slave camera.

In an example embodiment of the inventive concept, the control signal provided by the camera module controller 1216 to each of the camera modules 1100a, 1100b, and 1100c may include a sync enable signal. For example, when the camera module 1100b is a master camera, and the camera modules 1100a and 1100c are slave cameras, the camera module controller 1216 may transmit the sync enable signal to the camera module 1100b. The camera module 1100b having received the sync enable signal may generate a sync signal based on the received sync enable signal, and provide the generated sync signal to the camera modules 1100a and 1100c via the sync enable signal line SSL. The camera module 1100b and the camera modules 1100a and 1100c may be synchronized to the sync signal, and transmit the image data to the application processor 1200.

In an example embodiment of the inventive concept, the control signal provided by the camera module controller 1216 to the plurality of camera modules 1100a, 1100b, and 1100c may include mode information according the mode signal. Based on the mode information, the plurality of camera modules 1100a, 1100b, and 1100c may operate in a first operation mode and second operation mode with respect to a sensing speed.

The plurality of camera modules 1100a, 1100b, and 1100c may generate the image signal (for example, generate an image signal at a first frame rate) at a first speed in a first operation mode, encode the generated image signal (for example, encode the image signal at a second frame rate greater than the first frame rate) at a second speed higher than the first speed, and transmit the encoded image signal to the application processor 1200. In this case, the second speed may be equal to or less than 30 times the first speed.

The application processor 1200 may store the received image signal, in other words, the encoded image signal, in the internal memory 1230 included therein or the storage 1400 outside the application processor 1200, then, read and decode the encoded signal from the internal memory 1230 or the storage 1400, and display image data that is generated based on the decoded image signal. For example, a sub-image processor corresponding to the plurality of sub-image processors 1212a, 1212b, and 1212c of the image processing device 1210 may perform decoding, and in addition, may perform image processing on the decoded image signal.

The plurality of camera modules 1100a, 1100b, and 1100c may, in the second operation mode, generate the image signal (for example, generate the image signal at a third frame rate less than the first frame rate) at a third speed lower than the first speed, and transmit the image signal to the application processor 1200. The image signal provided to the application processor 1200 may include an un-encoded signal. The application processor 1200 may perform the image processing on the received image signal, or store the received image signal in the internal memory 1230 or the storage 1400.

The PMIC 1300 may provide power, for example, a power voltage, to each of the plurality of camera modules 1100a, 1100b, and 1100c. For example, the PMIC 1300 may provide first power to the camera module 1100a via a power signal line PSLa under the control of the application processor 1200, provide second power to the camera module 1100b via a power signal line PSLb, and provide third power to the camera module 1100c via a power signal line PSLc.

The PMIC 1300 may, in response to a power control signal PCON from the application processor 1200, generate power corresponding to each of the plurality of camera modules 1100a, 1100b, and 1100c, and in addition, may adjust a level of the generated power. The power control signal PCON may include a power adjustment signal per operation mode of the plurality of camera modules 1100a, 1100b, and 1100c. For example, the operation mode may include a low power mode, and in this case, the power control signal PCON may include information about a camera module operating at a low power mode and a set power level. The levels of power provided to each of the plurality of camera modules 1100a, 1100b, and 1100c may be identical to or different from each other. In addition, the level of power may be dynamically changed.

While the inventive concept has been particularly shown and described with reference to embodiments thereof, it will be understood that various changes in form and details may be made thereto without departing from the spirit and scope of the inventive concept as set forth in the following claims.

What is claimed is:

1. An image sensor, comprising:
 a pixel array comprising a plurality of pixels arranged in a matrix, wherein each of the pixels comprises a photoelectric conversion element configured to generate and accumulate photocharges based on an amount of external incident light, a transmission transistor configured to transmit the photocharges generated by the photoelectric conversion element to a floating diffusion node, and a reset transistor configured to reset the floating diffusion node based on a pixel power voltage, wherein the photoelectric conversion element includes a terminal to which a pixel reference voltage is applied; and
 a row driver configured to control the pixels, wherein the row driver comprises a transmission control signal generator configured to provide a transmission control signal to a gate electrode of the transmission transistor,
 wherein the transmission control signal generator comprises:
 a first transistor of a first conductivity type and including a source electrode to which a first voltage is applied;
 a second transistor of the first conductivity type and including a source electrode connected to a drain electrode of the first transistor;
 a third transistor of a second conductivity type and including a source electrode to which a second voltage is applied, the second voltage being higher than the first voltage; and
 a fourth transistor of the second conductivity type and including a source electrode connected to a drain electrode of the third transistor,
 wherein an ON resistance of the second transistor is different from an ON resistance of the first transistor.

2. The image sensor of claim 1, wherein an ON resistance of the fourth transistor is different from an ON resistance of the third transistor.

3. The image sensor of claim 1, wherein the second and third transistors maintain a turn-on state.

4. The image sensor of claim 1, wherein a first resistance adjustment voltage greater than the pixel reference voltage and less than the pixel power voltage is applied to a gate electrode of the second transistor.

5. The image sensor of claim 4, wherein a second resistance adjustment voltage greater than pixel reference voltage and less than the pixel power voltage is applied to a gate electrode of the fourth transistor.

6. The image sensor of claim 5, wherein the first resistance adjustment voltage is greater than the second resistance adjustment voltage.

7. The image sensor of claim 6, wherein at least any one of a channel length and a channel width of the second transistor is less than any corresponding one of a channel length and a channel width of the first transistor.

8. The image sensor of claim 6, wherein a channel doping concentration of the second transistor is less than a channel doping concentration of the first transistor.

9. The image sensor of claim 6, wherein a body doping concentration of the second transistor is greater than a body doping concentration of the first transistor.

10. The image sensor of claim 6, wherein a thickness of a gate oxide of the second transistor is less than a thickness of a gate oxide of the first transistor.

11. The image sensor of claim 6, wherein a doping concentration of polysilicon constituting the gate electrode of the second transistor is different from a doping concentration of polysilicon constituting a gate electrode of the first transistor.

12. The image sensor of claim 6, wherein one of the first and second transistors comprises doped polysilicon, and the other comprises a metal material.

13. The image sensor of claim 1, wherein the pixel power voltage is applied to a gate electrode of the second transistor, and
the pixel reference voltage is applied to a gate electrode of the third transistor.

14. An image sensor; comprising:
a pixel array comprising a plurality of pixels, wherein each of the pixels comprises a photoelectric conversion element configured to generate and accumulate photocharges and a transmission transistor configured to transmit the photocharges generated by the photoelectric conversion element, to a floating diffusion node; and
a row driver configured to control the pixels, wherein the row driver comprises: a transmission control signal generator configured to provide a transmission control signal to a gate electrode of the transmission transistor; and
a plurality of transmission signal lines connecting the transmission transistor to the transmission control signal generator,
wherein the transmission control signal generator further comprises:
a first transistor of a first conductivity type in which a first voltage is applied to a source electrode thereof;
a second transistor of the first conductivity type comprising a source electrode connected to a drain electrode of the first transistor;
a third transistor of a second conductivity type in which a second voltage higher than the first voltage is applied to a source electrode thereof;
a fourth transistor of the second conductivity type comprising a source electrode connected to a drain electrode of the third transistor; and
a delay circuit connected between a drain electrode of each of the second and fourth transistors and the transmission signal lines,
wherein the delay circuit is configured to delay a transmission control signal output by the drain electrode of each of the second and fourth transistors, and
wherein an ON resistance of the second transistor is different from an ON resistance of the first transistor.

15. The image sensor of claim 14, wherein the delay circuit comprises a delay resistor and a delay capacitor.

16. An image sensor, comprising:
a pixel array comprising a plurality of pixels, wherein each of the pixels comprises a photoelectric conversion element in which a pixel reference voltage is applied to an electrode thereof, a transmission transistor configured to transmit photocharges generated by the photoelectric conversion element to a floating diffusion node, and a reset transistor configured to reset the floating diffusion node based on a pixel power voltage; and
a row driver configured to control the pixels, wherein the row driver comprises a transmission control signal generator configured to provide a transmission control signal, which is a pulse signal changing between a first voltage and a second voltage higher than the first voltage, to a gate electrode of the transmission transistor,
wherein the transmission control signal generator comprises:
a first transistor of a first conductivity type in which the first voltage is applied to a source electrode thereof;
a second transistor of a second conductivity type in which the second voltage is applied to a source electrode thereof; and
a current limiter arranged between the first and second transistors,
wherein the current limiter comprises:
a third transistor of the first conductivity type comprising a source electrode connected to a drain electrode of the first transistor; and
a fourth transistor of the second conductivity type comprising a source electrode connected to a drain electrode of the second transistor,
wherein an ON resistance of the third transistor is different from an ON resistance of the first transistor, and
an ON resistance of the fourth transistor is different from an ON resistance of the second transistor.

17. The image sensor of claim 16, wherein the ON resistance of the third transistor is higher than the ON resistance of the first transistor, and
the ON resistance of the fourth transistor is higher than the ON resistance of the second transistor.

18. The image sensor of claim 16, wherein a first resistance adjustment voltage higher than the pixel reference voltage and lower than the pixel power voltage is applied to a gate electrode of the third transistor,
a second resistance adjustment voltage higher than the pixel reference voltage and lower than the pixel power voltage is applied to a gate electrode of the fourth transistor, and
the first resistance adjustment voltage is higher than the second resistance adjustment voltage.

19. The image sensor of claim 16, wherein at least one of a channel length, a channel width, a channel doping concentration, a body doping concentration, a thickness of a gate oxide, and a gate electrode composition of the third transistor is different from a corresponding one of a channel length, a channel width, a channel doping concentration, a body doping concentration, a thickness of a gate oxide, and a gate electrode composition of the first transistor.

\* \* \* \* \*